US008430531B2

(12) United States Patent
Catalano

(10) Patent No.: US 8,430,531 B2
(45) Date of Patent: Apr. 30, 2013

(54) ADVANCED COOLING METHOD AND DEVICE FOR LED LIGHTING

(75) Inventor: Anthony Catalano, Boulder, CO (US)

(73) Assignee: TerraLUX, Inc., Longmont, CO (US)

( * ) Notice: Subject to any disclaimer, the term of this patent is extended or adjusted under 35 U.S.C. 154(b) by 681 days.

(21) Appl. No.: 12/652,727

(22) Filed: Jan. 5, 2010

(65) Prior Publication Data

US 2010/0170670 A1 Jul. 8, 2010

Related U.S. Application Data

(60) Provisional application No. 61/143,292, filed on Jan. 8, 2009.

(51) Int. Cl.
*F21V 29/00* (2006.01)
*H05K 7/20* (2006.01)

(52) U.S. Cl.
USPC ....... 362/294; 362/373; 361/699; 165/104.22

(58) Field of Classification Search .................. 362/294, 362/373; 361/689, 699; 257/714; 165/10, 165/104.22
See application file for complete search history.

(56) References Cited

U.S. PATENT DOCUMENTS

| | | | | |
|---|---|---|---|---|
| 5,195,020 | A * | 3/1993 | Suzuki et al. | 361/699 |
| 5,462,685 | A * | 10/1995 | Raj et al. | 252/62.56 |
| 5,723,059 | A * | 3/1998 | Snyder, Jr. | 252/70 |
| 6,019,165 | A * | 2/2000 | Batchelder | 165/80.3 |
| 6,910,794 | B2 * | 6/2005 | Rice | 362/547 |
| 7,295,435 | B2 * | 11/2007 | Ouyang | 361/699 |
| 7,309,145 | B2 * | 12/2007 | Nagata et al. | 362/294 |
| 7,973,434 | B2 * | 7/2011 | Yazawa et al. | 310/11 |
| 8,033,689 | B2 * | 10/2011 | Scott | 362/294 |
| 2003/0052584 | A1 | 3/2003 | Matsui et al. | |
| 2006/0090474 | A1 * | 5/2006 | Sauciuc et al. | 62/3.2 |
| 2007/0252268 | A1 * | 11/2007 | Chew et al. | 257/714 |
| 2008/0013316 | A1 | 1/2008 | Chiang | |
| 2008/0219007 | A1 | 9/2008 | Heffington et al. | |
| 2009/0052187 | A1 * | 2/2009 | Li | 362/294 |
| 2009/0126922 | A1 * | 5/2009 | Vetrovec | 165/185 |

OTHER PUBLICATIONS

International Search Report and Written Opinion, PCT/US2010/020377, dated Aug. 25, 2010, 9 pages.

* cited by examiner

*Primary Examiner* — Peggy A. Neils
(74) *Attorney, Agent, or Firm* — Bingham McCutchen LLP

(57) ABSTRACT

A light emitting diode cooling device and method are disclosed for passively removing heat from the LED using liquid convection to cool the LED. The liquid convection cooling device operates to cool the LED by circulating a liquid cooling medium without consuming external power to move the medium.

41 Claims, 11 Drawing Sheets

ADVANCED COOLING METHOD AND DEVICE FOR LED LIGHTING

RELATED APPLICATIONS

The present application claims priority from U.S. Provisional Application Ser. No. 61/143,292, filed on Jan. 8, 2009, which is incorporated herein by reference.

BACKGROUND

Light emitting diodes (LEDs) have gained popularity for use in general illumination because of their very long life and relatively low operating cost in comparison to conventional incandescent lighting. An array of LEDs can produce light intensity sufficient to replace an MR-16 incandescent lamp or an equivalent fluorescent lamp. Due to their small size, LEDs can be arranged in fairly dense arrays to produce a significant amount of light per area, especially when multiple die and/or high intensity LEDs are used.

High power and high density LEDs produce large amounts of heat along with the high light output produced. As the density of the LEDs increase, the amount of heat dissipation needed also increases. LEDs are extremely sensitive to operating temperatures. High temperatures can reduce the light output, or Lumens per Watt, and can also reduce the operating lifetime, or even destroy the LED. Because of these temperature concerns, heat dissipation devices have been developed to cool the LEDs.

Some conventional heat dissipation devices use passive systems with heat sinks made from high thermal conductivity metals, such as aluminum or copper, to move heat away from the LED to where the heat can be dissipated into the surrounding air using cooling fins or other such structures. In some applications, however, these heat sinks cannot move heat quickly enough from the local area of the die because the amount of heat produced by multi-die and other high power LEDs is more than can be removed with a heat sink that is reasonably small enough to be included in a LED lighting product. Moreover, when the pure metals characterized by high thermal conductivity are alloyed with other metals to improve machinability, or to allow casting or forging, the thermal conductivity of the alloy metal is significantly diminished.

Another heat removal system involves the use of a heat pipe. The heat pipe systems are an attractive solution to LED heat problem in that they are light weight and allow for a heat exchanger to be located remotely. Moreover, the thermal conductivity of these systems can be as high as metals because they rely on the transition between liquid and vapor and the enthalpy of transition is high for liquids such as water. However, the heat capacity of vapor based heat pipes is low and poses a limitation on the amount of heat that can be removed since the transport of the liquid and the amount of liquid in the system present an upper limit to the amount of heat that can be transported and removed. Since only a small volume of liquid can be accommodated (usually a few cc's), the total amount of heat that can be moved is low. Furthermore, the cost of fabrication of a heat pipe system can make the system cost prohibitive.

Convection can be used to remove heat from the LED in some instances. However, since convection relies on gravity to work, the LED must be oriented so that the convection heat path is up from the LED location to move the heat away from the LED. Since lighting products must operate in a variety of orientations, conventional convection heat removal is not always the best solution. In addition, traditional convection uses air to carry the heat. Air has a relatively low heat capacity and therefore cannot remove heat rapidly unless impractically large volumes of air are used.

Any cost effective method that lowers the temperature of the LED during operation will improve the efficiency of the light device, provided it does not consume the power gained in the process. A fan would have to be utilized in order to move enough air to remove the heat from the LEDs using air for convection. Fans, like other active cooling methods, draw energy and reduce the efficiency of the light device. In addition, fans do not have the operating lifetime of a LED which can be from 50 to 100 k hours. Fans also create noise, which is an unnecessary distraction that a lighting device can do without.

Conventional liquid cooling can also be used and also has some beneficial attributes. One benefit is that liquid has a higher thermal conductivity that air and so can carry heat away from the LED with much greater efficiency. However, conventional liquid cooling systems use pumping which adds additional cost and energy usage and decreases the overall operating lifetime and efficiency of the lighting device because of the mechanical pump.

The present invention provides a highly advantageous LED cooling device and method that are submitted to resolve the foregoing problems and concerns while providing still further advantages, as described hereinafter.

SUMMARY

The present invention overcomes the limitations of conventional active and passive LED cooling devices by providing passive cooling that is capable of removing heat from the LED rapidly and in large enough amounts to prevent the LED from overheating during operation.

In one embodiment, according to the present disclosure, a method for cooling at least one light emitting diode (LED) is disclosed. The LED includes an LED die that generates light and heat when electrical power is applied to the LED. A heat exchange medium container is arranged to include a wall arrangement including at least one wall. The wall has a thickness that extends between an exterior surface configuration and an interior surface configuration such that the interior surface configuration defines an inner cavity volume. The container also having an LED mounting area for mounting the LED to the exterior surface configuration of the container to transfer heat from the LED to a heat receiving portion of the interior surface configuration of the wall. The inner cavity is at least partially filled with a liquid heat exchange medium. The liquid heat exchange medium fills the inner cavity such that the medium contacts the heat receiving portion of the interior surface configuration of the wall in at least one physical orientation of the container to receive heat from the LED through the wall. The liquid heat exchange medium moves at least a portion of the heat received away from the LED using convection. The liquid heat exchange medium is sealed in the inner cavity.

In another embodiment, another method for cooling at least one light emitting diode (LED) is disclosed. The LED has an LED die that generates light and heat when electrical power is applied to the LED. A heat exchange medium container is arranged with a wall arrangement including at least one wall having a thickness that extends between an exterior surface configuration and an interior surface configuration. The interior surface configuration defines an inner cavity volume. The container also has an LED mounting area for mounting the LED to the exterior surface configuration of the container to transfer heat from the LED to a heat receiving portion of the interior surface configuration of the wall. The inner cavity volume is at least partially filled with a magnetic fluid to at least cover the heat receiving portion of the interior surface of the wall. The magnetic fluid receives heat from the LED at the heat receiving portion. The magnetic fluid is selected to be relatively more magnetic when at a relatively cooler temperature and relatively less magnetic when at a relatively hotter temperature. The operation of the LED causes the magnetic fluid proximate to the LED to heat to a temperature sufficient to cause the fluid to become relatively less magnetic. A magnetic field is positioned to circulate the magnetic fluid by magnetically attracting relatively cooler magnetic fluid toward the LED to push relatively hotter magnetic fluid heated by the LED away from the LED to remove heat from the LED during operation of the LED.

In yet another embodiment, a light emitting diode (LED) cooling device is disclosed. The cooling device is arranged for cooling at least one light emitting diode (LED) having an LED die that generates light and heat when electrical power is applied to the LED. The cooling device includes a heat exchange medium container having a wall arrangement that includes at least one wall. The wall has a thickness that extends between an exterior surface configuration and an interior surface configuration of the container such that the interior surface configuration defines an inner cavity volume. The container also having an LED mounting area for mounting the LED to the exterior surface configuration of the container to transfer heat from the LED to a heat receiving portion of the interior surface configuration of the wall. The cooling device also includes a liquid heat exchange medium at least partially filling the inner cavity volume. The medium contacts the heat receiving portion of the interior surface configuration of the wall in at least one physical orientation of the container to receive heat from the LED through the wall. The medium moves at least a portion of the heat received away from the LED using convection, and the medium is sealed in the inner cavity.

In another embodiment, another cooling device for cooling at least one light emitting diode (LED) is disclosed. The cooling device has an LED die that generates light and heat when electrical power is applied to the LED. The cooling device includes a heat exchange medium container that is configured with a wall arrangement including at least one wall. The wall has a thickness that extends between an exterior surface configuration and an interior surface configuration of the container such that the interior surface configuration defines an inner cavity volume. The container also has an LED mounting area for mounting the LED to the exterior surface configuration of the container to transfer heat from the LED to a heat receiving portion of the interior surface configuration of the wall. The cooling device also includes a magnetic fluid that at least partially fills the inner cavity volume to at least cover the heat receiving portion of the interior surface of the wall with the magnetic fluid to receive heat from the LED. The magnetic fluid has a characteristic in which the fluid is relatively more magnetic when at a relatively cooler temperature and relatively less magnetic when at a relatively hotter temperature. The fluid is such that operating the LED causes the magnetic fluid proximate to the LED to heat to a temperature sufficient to cause the fluid to become relatively less magnetic. The cooling device also includes a magnet that has a magnetic field that is positioned to circulate the magnetic fluid by magnetically attracting relatively cooler magnetic fluid toward the LED to push relatively hotter magnetic fluid heated by the LED away from the LED to remove heat from the LED during operation of the LED.

BRIEF DESCRIPTION OF THE DRAWINGS

The present invention may be understood by reference to the following detailed description taken in conjunction with the drawings, in which.

DETAILED DESCRIPTION

Figure 1:
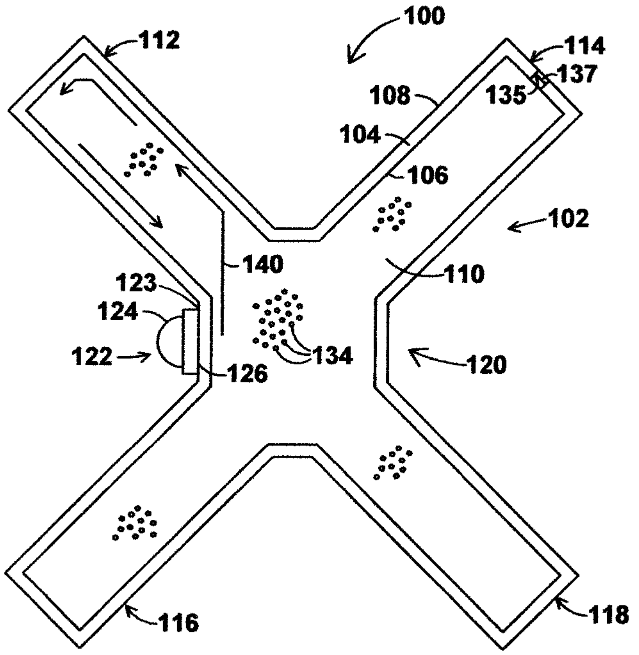
FIG. 1 is a diagrammatic view, in elevation, of an LED cooling device in a first orientation.

While this invention is susceptible to embodiment in many different forms, there are shown in the drawings, and will be described herein in detail, specific embodiments thereof with the understanding that the present disclosure is to be considered as an exemplification of the principles of the invention and is not to be limited to the specific embodiments described. Descriptive terminology such as, for example, uppermost/lowermost, right/left, front/rear and the like may be adopted for purposes of enhancing the reader's understanding, with respect to the various views provided in the figures, and is in no way intended as been limiting.

Referring to the drawings, wherein like components may be indicated by like reference numbers throughout the various figures, FIG. 1 illustrates one embodiment of a light emitting diode (LED) cooling device, generally indicated by the reference number 100. Cooling device 100, which is diagrammatically shown in FIG. 1 in elevation, includes a container 102 with a wall 104 that is arranged with a thickness that extends between an exterior surface configuration 108 and an interior surface configuration 106. The interior surface configuration defines an inner cavity volume 110 of the container. In the diagrammatic view shown, the container can be described as having four legs; a leg 112, a leg 114, a leg 116 and a leg 118, which extend outwardly from a center section 120 of the container. Container 102 can be made from a material having a good thermal conductivity, such as aluminum, although there are many other suitable materials. Container 102 can be cast or can be manufactured using other manufacturing techniques.

An LED 122 is shown in FIG. 1 mounted to the container at a mounting area 123 of the exterior surface configuration. LED 122 includes a front side 124 and a back side 126. The front side includes a lens where light is directed out of the LED. The back side of the LED is mounted to the exterior surface of the container at the mounting area. The LED generates light when it receives an operating current and operating voltage. When the LED generates light, the LED also produces heat. Driving circuitry, wiring, a power source and other components for powering the LED are not shown in this example but are understood to be present.

Figure 2:
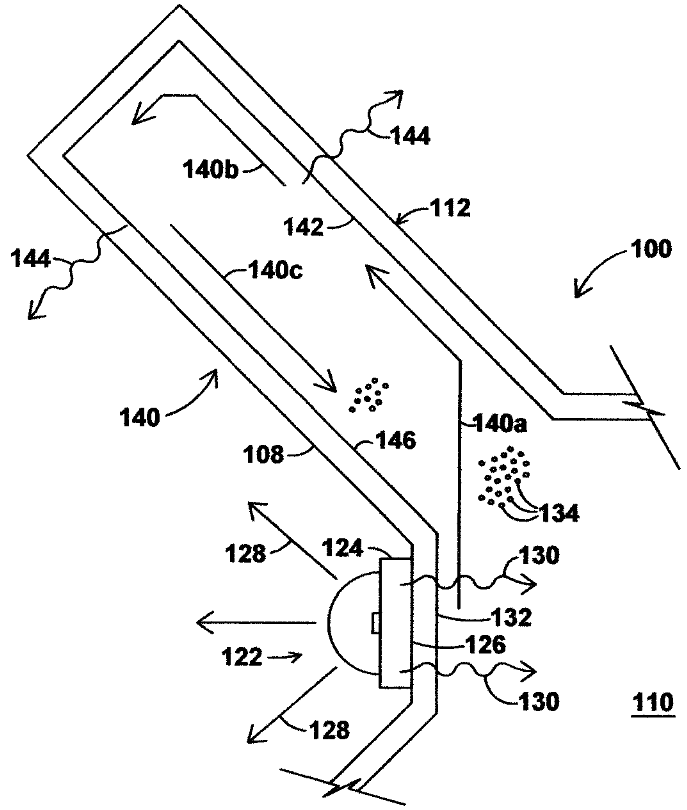
FIG. 2 is an enlarged view of a portion of the LED cooling device shown in FIG. 1, showing details of the cooling device and operation of the cooling device.

FIG. 2 is a further enlarged elevational view of a portion of the cooling device shown in FIG. 1. LED 122 is mounted to the center section of the container at a location that provides for efficient heat transfer between the back side of the LED and the outer surface of the container. Materials, such as heat conduction gel or other materials can be included between the back side of the LED and the surface of the container to improve or ensure efficient heat transfer from the LED to the container. When LED 122 is powered, light 128 emanates from front side 124 and heat is produced. Heat, represented by wavy lines 130, conducts through wall 104 of the container and enters inner cavity 110 at a heat receiving portion 132 of interior surface 106. The heat receiving portion may be considered as directly opposite the base of the LED.

Cooling device 100 includes a heat exchange medium 134 that is represented by small circular dots. Heat exchange medium 134 is a liquid that can be mineral oil, silicon-based oil, a fluid containing fine metal particles suspended in a liquid, or other liquid like material that is suitable for carrying heat energy. The heat exchange medium fills inner cavity of the container at least to a point where a level of the liquid is above heat receiving portion 132 of the interior surface. The heat exchange medium can be deposited into the inner cavity of the container through a filler hole 135 which can then be sealed using a seal 137 to retain the medium in the cavity. In the present example, the inner cavity is essentially filled with medium 134 at least from a practical standpoint, although this is not a requirement.

Heat 130 from the LED passes through the wall of the container and enters the interior of the container at the heat receiving portion. The heat energy is then transferred to the heat exchange medium which causes a convection current or path 140 in the heat exchange medium, portions of which are represented by arrows 140*a*, 140*b* and 140*c*. The heated medium near the heat receiving portion rises, as shown by arrow 140*a*, into an upper cavity volume where the heated medium contacts an inner surface 142 of container leg 112. Once the heated medium reaches inner surface 142, the heated medium begins to travel upward along the inner surface 142, as shown by arrow 140*b*. As the heated medium travels along inner surface 142, heat energy is transferred from the medium to container leg 112, as represented by wavy lines 144, and through the wall of the container leg to the surrounding atmosphere. The medium that is relatively hotter travels along the upper inner surface of the container leg away from the LED. As the medium cools by releasing heat through the leg, the relatively cooler medium is forced back toward the LED along a bottom inner surface 146 of container leg 112. As the relatively cooler portion of the medium gets closer to the LED, the medium receives more heat from the LED and the portion of medium rises. In this way, the medium circulates from the relatively hotter area near the LED to the relatively cooler area in the container leg, and back again. This convective circulation moves heat away from the LED, thereby cooling the LED. Although not specifically shown in FIGS. 1 and 2, the heat exchange medium can also circulate in container leg 114.

Figure 3:
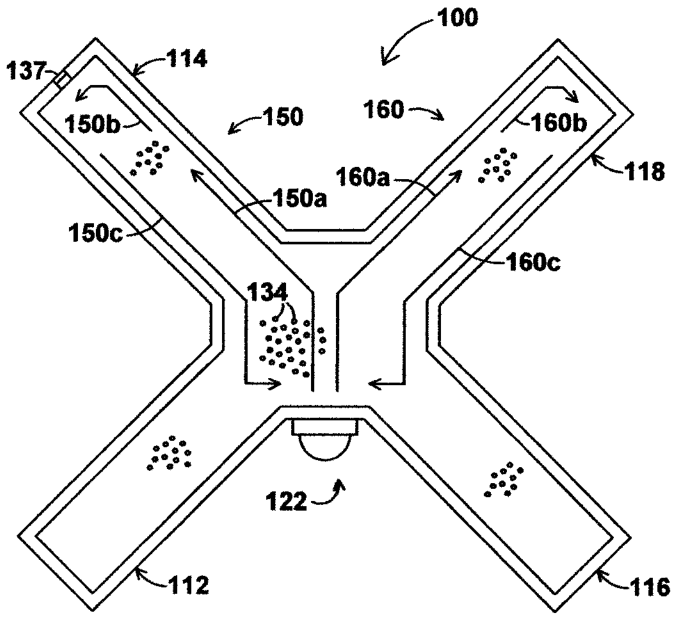
FIG. 3 is another diagrammatic view, in elevation, of the LED cooling device of FIG. 1, but shown in a different orientation.

Cooling device 100 is shown in another orientation in FIG. 3. In this orientation, the LED is positioned at the bottom of the center section and container legs 114 and 118 are positioned above the LED. Heat from the LED circulates in the heat exchange medium in convection paths 150 and 160 through upper cavity volumes in container legs 150 and 160, respectively. Convection path 150 includes a first direction, represented by arrow 150*a*, where heat from the LED is received by the medium in the center section and the heated portion of the medium rises into leg 114. Relatively hotter medium rises to displace relatively cooler medium in LED 114, as shown by arrow 150*b*, and heat is removed from the medium through container leg 114 to the atmosphere. The relatively cooler medium travels back through the container leg toward the LED, as shown by arrow 150*c* where the circulation continues. Convection path 160 includes a first direction, represented by arrow 160*a*, where the medium heated by the LED rises up away from the LED and into container leg 118. Convection path 160 continues toward the end of leg 118, distal from the LED, along a path portion represented by arrow 160*b*. The path portion continues around the end of the container leg where relatively hotter medium rises to replace relatively cooler medium which is forced back toward the LED along a convection path represented by arrow 160*c*. Convection paths 150 and 160 move heat away from LED 122 to the container legs where the heat is transferred to the atmosphere.

Figure 4:
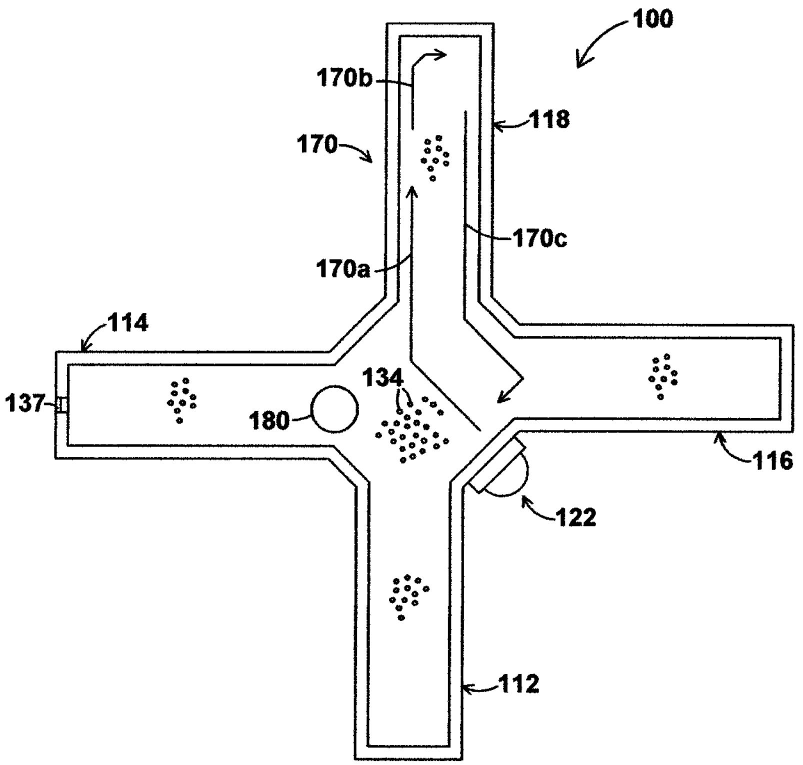
FIG. 4 is still another diagrammatic view of the LED cooling device of FIG. 1, but shown in a different orientation as compared to FIGS. 1 and 3.

Another orientation of cooling device 100 is shown in FIG. 4. In this orientation, container leg 118 is positioned generally vertically above the LED and the center section. A convection path 170 moves heated medium up and away from the LED along a path portion 170*a* into the upper cavity volume in container leg 118. Heated medium continues to rise until it reaches the end of the container leg 118 that is distal from the center section. As the heated medium loses heat, relatively hotter medium pushes toward the end and replaces the relatively cooler medium as shown by a path portion 170*b*. Relatively cooler medium continues down towards the center section and the LED along a path portion 170*c* to where the medium is again heated by the LED to continue the circulation along path portion 170*a*.

A compressible element 180 is shown in the embodiment in FIG. 4 positioned in inner cavity 110 in the liquid heat exchange medium. The compressible element can be made from a low density compressible material or a hollow structure and can be in the shape of a ball as shown or can have another suitable shape. Moreover, a plurality of such compressible elements may be provided. The compressible element acts as a volume buffer in that it is compressible to allow the volume of the heat exchange medium to increase when it gets hot. The compressible element can keep the expanding medium from rupturing the container when the cavity is filled by the liquid medium and sealed.

As shown by FIGS. 1-4, container 102 can be moved to any orientation while still providing liquid convection cooling for the LED. The container can be sealed after the medium is deposited into the inner cavity to retain the medium in the container. Since convection relies on gravity, for liquid convection to move heat away from the LED at least some of the liquid heat exchange medium can be above the LED in a given orientation. In the present embodiment, the shape of the container allows a portion of the heat exchange medium to be above the LED in any orientation, thus allowing convection to cool the LED.

Figure 5:
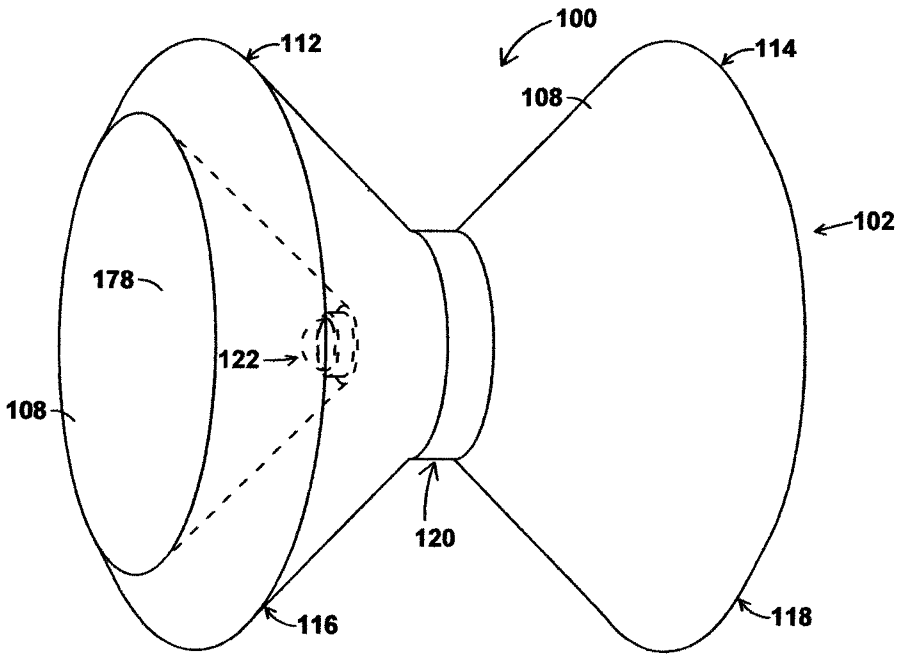
FIG. 5 is a perspective view of the LED cooling device shown in FIGS. 1-4.

FIG. 5 shows a perspective view of LED cooling device 100 from which FIGS. 1-4 are taken in varying elevational views. Thus, it can be seen that the lines of the container in FIGS. 1-4 are representative of surfaces of rotation about a particular axis. The container can include a circular shape and may be used in an application for cooling an LED replacement of an MR-16 type lamp. The embodiment shown in FIG. 5 is capable of cooling the LED regardless of the orientation of the container.

The container can have at least a portion of the exterior surface polished or otherwise treated to create a reflective surface which can then be used to direct light from the LED. The container, shown in FIG. 5, includes a generally conical exterior surface 178 which can be used for directing light from LED 122. In the embodiment shown in FIGS. 1-4, arms 112 and 116 are elevational cut away view of portions of the conically shaped portion of the container which partially surrounds the LED. The arms can also be configured to cause a corresponding surface of rotation to have a parabolic or hyperbolic shape to produce a beam of light from the LED with uniform intensity along its diameter. Other shapes or textures to the surface may also be appropriate for influencing light distribution.

Figure 6:
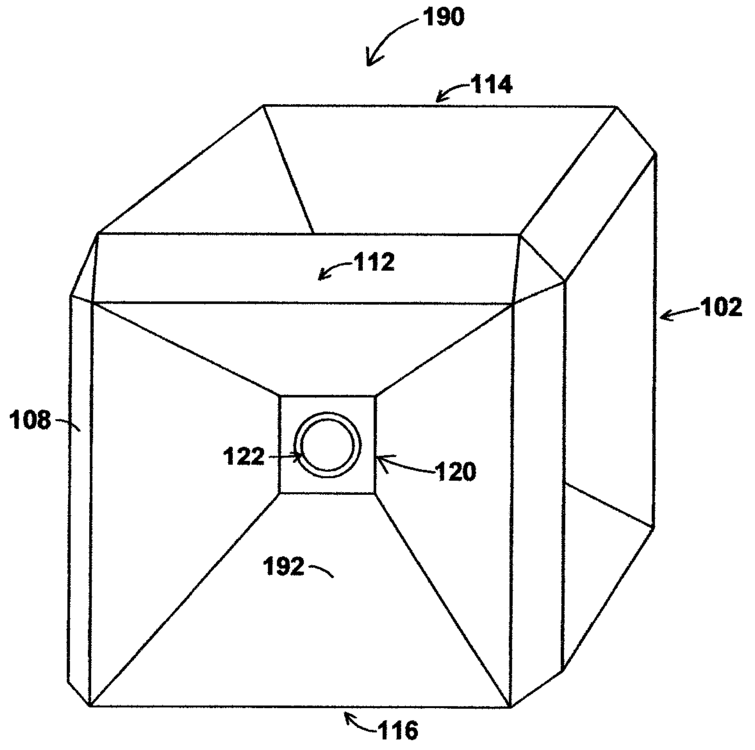
FIG. 6 is a perspective view of another LED cooling device.

Container 102 can have other shapes as well, as long as the shapes allow for the principles of operation described herein. In this regard, it is submitted that an essentially unlimited number of shapes may be used while remaining within the scope and teachings of this overall disclosure, so long as convective cooling is available in at least one physical orientation. Another embodiment of the LED cooling device is shown in FIG. 6 and is indicated by the reference number 190. This embodiment includes a more rectilinear shape than the embodiment shown in FIG. 5, as opposed to using surfaces of rotation, however the same principles of operation apply and the elevational views shown in FIGS. 1-4 remain applicable and can be used for understanding the operation of LED cooling device 190. Accordingly, features of LED cooling device 190 are designated to correspond with features in FIGS. 1-4. A surface area 192 can be used for directing light from the LED in the embodiment shown in FIG. 6, for example, including a reflective coating.

Figure 7:
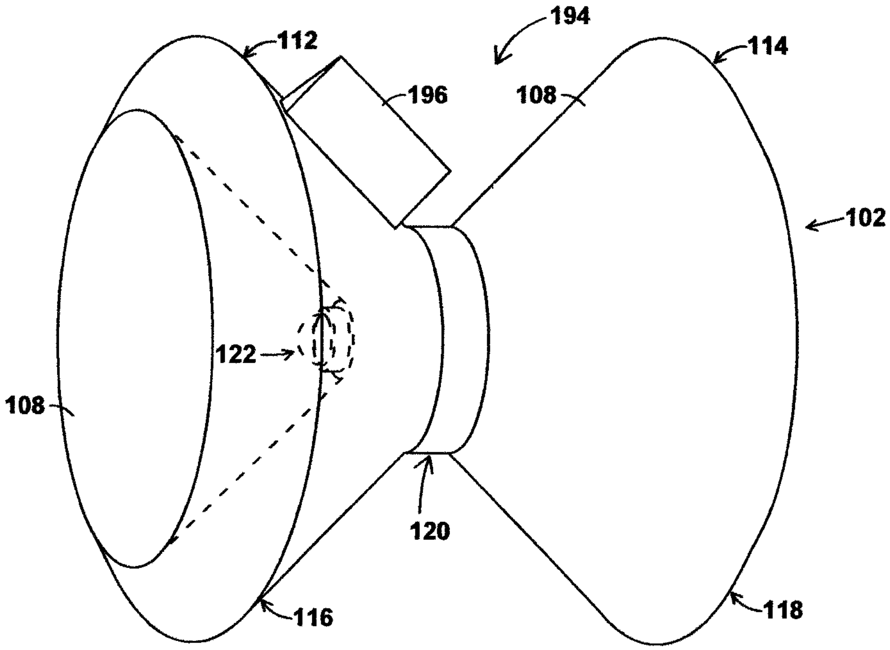
FIG. 7 is a perspective view of an LED cooling device with a heat transfer feature.

The container can include fins or other type of structure or structures to promote heat transfer from the material of the container to the surrounding atmosphere. FIG. 7 illustrates an LED cooling device 194 which includes a cooling fin 196. The cooling fin is exemplary of one or more cooling fins that can be used to increase the surface area of the container and to promote the heat exchange between the container and ambient air surrounding the container.

The convection paths shown are illustrative of a method for moving heat away from an LED to cool the LED. It should be understood that the medium will most likely travel in a path that includes many eddies and other currents and the paths illustrated should not be interpreted to require that the convection follow any specific path.

Liquid heat exchange medium 134 can include particles such as, for example, metal particles to increase the heat capacity or heat carrying capability of the fluid. The metal particles can be suspended in a buoyant material such as plastic or other low density material. The buoyant material can be selected such that the particles have a neutral buoyancy, positive buoyancy or negative buoyancy in comparison to the remainder of the medium.

Figure 8:
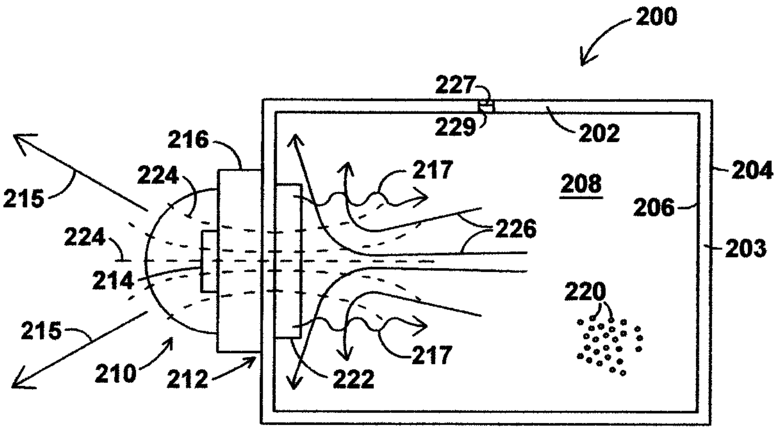
FIG. 8 is a diagrammatic view, in elevation, of another LED cooling device.

Another embodiment of an LED cooling device is shown in FIG. 8 and is generally designated with by the reference number indicator 200. LED cooling device 200 is a liquid cooling system that uses a forced, passive convection to move heat away from the LED. In this embodiment, cooling device 200 includes a container 202 having a wall 203 that has an outer surface 204 and an inner surface 206 that defines an inner cavity 208. An LED 210 is attached to the wall at an LED mounting area 212 that transmits heat from the LED through the wall to the inner cavity. The LED can be mounted to the wall using a thermally conductive substance to promote heat transfer from the LED to the wall. LED 210 includes an LED die 214 and a base 216. The die produces light, represented by arrows 215; and heat 217, represented by wavy lines, in response to receiving electrical energy. Circuitry for powering and controlling the LED is not shown in FIG. 8. The heat passes from the LED through the wall of the container and enters the inner cavity at a heat receiving portion 218 of the interior surface of the wall which may be considered as directly opposite the mounting area of the LED.

LED cooling device 200 uses a magnetic phase change ferromagnetic fluid 220, represented in FIG. 8 by small circular dots, (also referred to herein as a ferrofluid), as a heat exchange medium for receiving heat from the LED and moving the heat away from the LED. Ferrofluid 220 is one example of a magnetic fluid that can be used as a heat exchange medium in the present embodiment where the heat exchange medium has a magnetism that is relatively higher at relatively lower temperatures and is relatively lower at relatively higher temperatures, Ferrofluid 220 includes nanoparticles of a magnetic phase change material suspended in a fluid. The phase change material changes phase from a ferromagnetic state to a paramagnetic state depending on temperature. The material has a higher force of attraction to a magnet in the ferromagnetic state than when in the paramagnetic state. The phase change material enters the paramagnetic state at a ferrofluid Curie temperature and remains in the paramagnetic state as long as the temperature of the material remains at or above the ferrofluid Curie temperature. The Curie temperature is the temperature above which a material becomes non-magnetic (paramagnetic) and the ferrofluid Curie temperature refers to the specific Curie temperature of the ferrofluid which can be selected as discussed below. The phase change material stays in the ferromagnetic state below the ferrofluid Curie temperature and is ferromagnetic at room temperature. Magnetic phase change refers to the change between ferromagnetic and paramagnetic states of the material.

Cooling device 200 includes a magnet 222 that is positioned in the inner cavity at a position to receive heat from the LED. Magnet 222 creates a magnetic field, represented by dashed lines 224, which extends into the inner cavity of the container. Magnet 222 has a Curie temperature that is higher than a temperature generated by the heat from the LED so magnet 222 remains magnetic even when heated by the LED. Inner cavity 208 contains the ferrofluid to a level that at least partially covers the magnet so that heat from the LED is efficiently transferred to the ferrofluid.

In the present example, the magnet can be positioned anywhere so long as it attracts the magnetic fluid to the heat from the LED. In one embodiment, the magnet can be positioned on the exterior of the container in an arrangement that attracts the magnetic fluid to the heat from the LED. In another embodiment, the magnet can be built into the LED and arranged to replace a metal block called a slug that is typically used for transferring heat away from the die in the LED. In yet another embodiment, the magnet can be arranged to replace a portion of the wall of the container in which case the LED could be mounted at an exterior portion of the LED and the magnetic fluid can contact an interior portion of the LED. In still another embodiment, the magnet could be incorporated into the LED as discussed and could also be arranged to replace a portion of the wall of the container. In this configuration, the LED die could transfer heat to the magnet and the magnet could then transfer the heat to the magnetic fluid. More than one magnet can also be used and the magnet can have a different shape than that shown.

Heat from the LED die is transferred to the ferrofluid through the magnet in the present example. As the ferrofluid near the magnet is heated, it reaches the ferrofluid Curie temperature and enters the paramagnetic state. Once heated, the paramagnetic phase ferrofluid near the magnet is no longer attracted to the magnet and is pushed aside by lower temperature ferromagnetic phase ferrofluid that is attracted by the magnet. The heated paramagnetic ferrofluid forced away from the LED carries heat away from the LED thereby cooling the LED. The heated ferrofluid transfers the heat energy to the container which then transfers the heat to the surrounding atmosphere. As the heat is transferred to the atmosphere, the ferrofluid cools to below the ferrofluid Curie temperature and is again attracted to the magnet. In this way, the ferrofluid circulates in the container as represented by circulation lines 226 under the force of a non-mechanical pump. The ferrofluid removes heat by convection that is passive, in that no energy is added to the cooling device to move the fluid. The convection of the ferrofluid is also a forced convection in that the ferrofluid is forced to circulate because of the magnetic phase changes of the ferrofluid responsive to the heat generated by the operating LED.

In the ferrofluid LED cooling device embodiment shown in FIG. 8, the magnet has non-uniform magnetic field in that the field is stronger in the center of the magnet than it is toward the edges of the magnet, as represented by the magnetic field lines 224 that are closer together toward the center and further apart toward the edges. Although not a requirement, the highest field strength of the magnet can be located nearest to the LED die where the temperature is the highest. In this arrangement, the non-uniformity causes the magnetic ferrofluid to be forced toward the strongest part of the field which is also where the temperature is the highest. While the magnetic field lines are shown in FIG. 8 in one direction, the magnet can be oriented so that the magnetic field lines are arranged in other directions as well, so long as the magnet attracts the ferromagnetic ferrofluid toward the heat of the LED.

Container 202 can be made from aluminum or another suitable material that is efficient at transferring heat. The container can be made using casting or can be machined from a material. The container can be made from a material that is not ferrous so that the container does not interfere with the magnetic field attracting the ferrofluid toward the LED. The container can also be configured with a shape that allows the ferrofluid to contact the heat receiving portion of the inner cavity regardless of the physical orientation of the container, such as those containers shown in FIGS. 5 and 6, for example. An opening 227 can be used for filling the container with the ferrofluid and can be sealed with a seal 229.

The ferrofluid LED cooling device has the advantage of active pumping of the heat exchange medium without the limitations implicit in mechanical pumping devices. The cooling device can use high heat capacity fluid and can be made in nearly any size so long as the fluid is caused to receive heat in response to the magnetic field in a least one orientation of the container. The pumping action of the ferrofluid may be largely independent of gravity or orientation of the cooling device container, especially in embodiments having the inner cavity filled with the fluid. Accordingly, a wide variety of container shapes, magnet shapes/arrangements and locations are considered to fall within the scope of the appended claims.

The ferrofluid can be made to have a desired ferrofluid Curie temperature such that the system maintains the temperature of the LED at a safe operating temperature. This could include making the ferrofluid with a Curie temperature that would begin to remove heat from the LED before the safe operating temperature is reached. In this case, the ferrofluid Curie temperature could be below the safe operating temperature of the LED. For many LEDs, an upper temperature limit for high Lumen maintenance is about 80° C.

One example of a ferrofluid suitable for the magnetic phase change cooling device described can be an alloy of Composition 1:

$$Fe_2P_{1-x}As_x \text{ where } 1>x>0 \qquad \text{Composition 1}$$

The Curie temperature of this alloy can be adjusted from below room temperature to substantially above room temperature by altering the composition. The end member alloy $Fe_2P$ is ferromagnetic with a Curie temperature of −48° C. However, as the As is added to replace P, the Curie temperature rises sharply. This phenomenon occurs as a consequence of anion (As) ordering on preferred crystallographic sites that enhance electron spin ordering and stabilize the ferromagnetic state.

Figure 9:
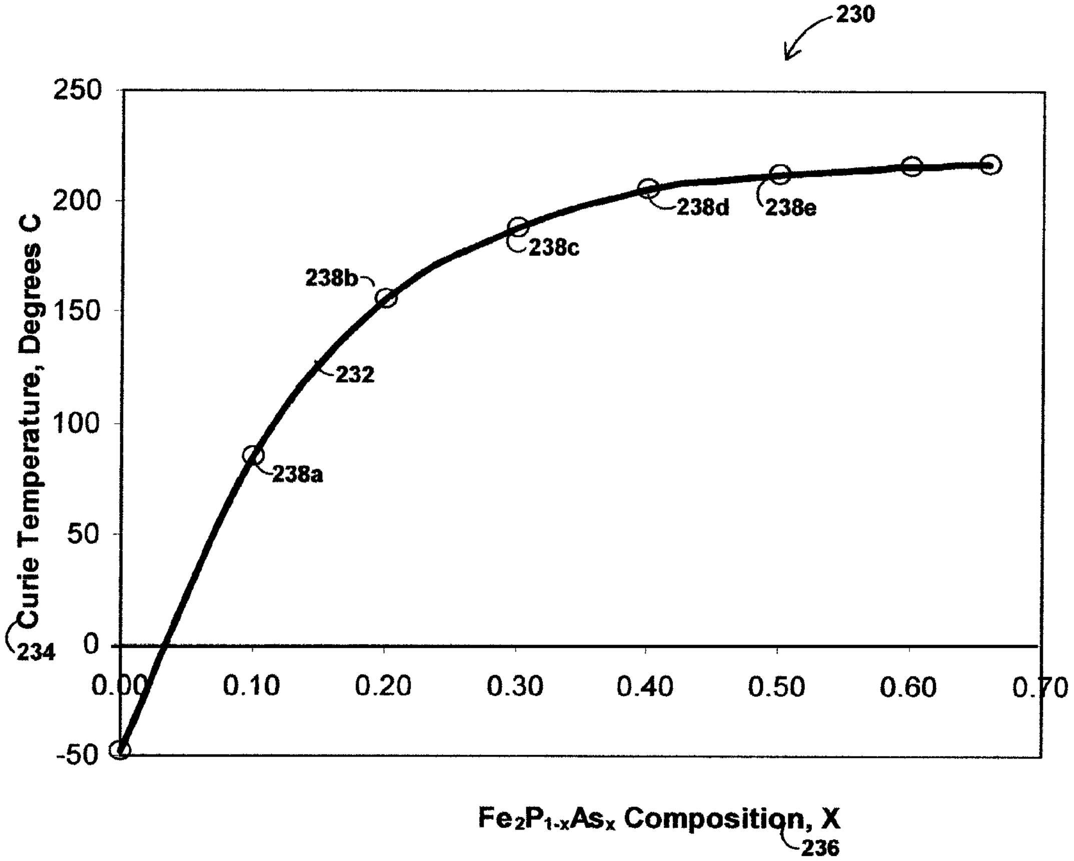
FIG. 9 is a graph of characteristics of a heat exchange medium that can be used in the LED cooling device shown in FIG. 8.

FIG. 9 shows a graph 230 that includes a curve 232 that plots Curie temperature 232 against the X value 234 of Composition 1. Curve 232 includes circles 238*a-e* that show where selected values of X along the bottom of the graph intersect with the curve. For instance, by selecting X to be 0.1 in Composition 1, the circle 238*a* on curve 232 indicates that the alloy composition will have a Curie Temperature of about 85° C. The range of Curie temperatures in the graph overlaps the range of temperatures that include acceptable upper limits for the temperature needed to ensure long term operation of high brightness white LEDs.

Alloys of Composition 1 can be prepared by direct combination of the elements. The elements can be sealed in a fused silica ampoule and heated for a prolonged period of time to homogenize the alloy. For production, however, it could be more favorable to prepare the material in a more scalable process, such as precipitation from solution, which would also permit the formation of the small particle (10-100 nanometer scale) size required for the suspension in a non-aqueous solution.

Other ferrofluids besides the alloys of Composition 1 can also be used in the LED cooling device provided the cooling device is able to provide sufficient cooling for the LED. One type of ferromagnetic materials includes $Zn_{0.5}Co_{0.5}Fe_{1.9}O_4$ which has a Curie temperature of 115° C., which may be too high, but may be used for experimental purposes. Ferrite particles can be used in a ferrofluid and are relatively easy to prepare by precipitation in the nanoscale size needed for suspension in solution. However, the Curie temperatures for Ferrite particles are relatively high, being greater than 100° C., which may be unsuitable for LED cooling. A pressure difference, ΔP produced by the action of the magnetic field depends on a temperature difference of the magnetization of the metal particles M(T), the permeability, μ and the magnetic field strength, H in Equation 1:

$$\Delta P=\mu H[M(T\text{out})-M(T\text{in})] \qquad \text{Equation 1.}$$

Fluid flow of the ferrofluid can be modeled using Equation 1, however Equation 1 does not take into account the non-uniformity of the magnetic field which should provide an added driving force. The influence of the Curie temperature is included in Equation 1 in the form of the dependence of the magnetization on temperature. The magnetization of a ferromagnetic substance drops quickly as the temperature approaches the Curie temperature and this has an important quantitative effect on fluid flow.

Other types of magnetic fluid can also be used so long as they have a magnetism that changes with temperature in a way which allows for fluid flow where relatively cooler fluid is attracted from a distal position toward the LED to push relatively hotter fluid proximal to the LED away from the LED. The magnetic fluid can be relatively more magnetic when at a relatively cooler temperature and relatively less magnetic at a relatively hotter temperature. The magnetic fluid can also exhibit a lower or non-magnetic state that is diamagnetic or anti-ferromagnetic at relatively hotter temperatures.

Figure 10:
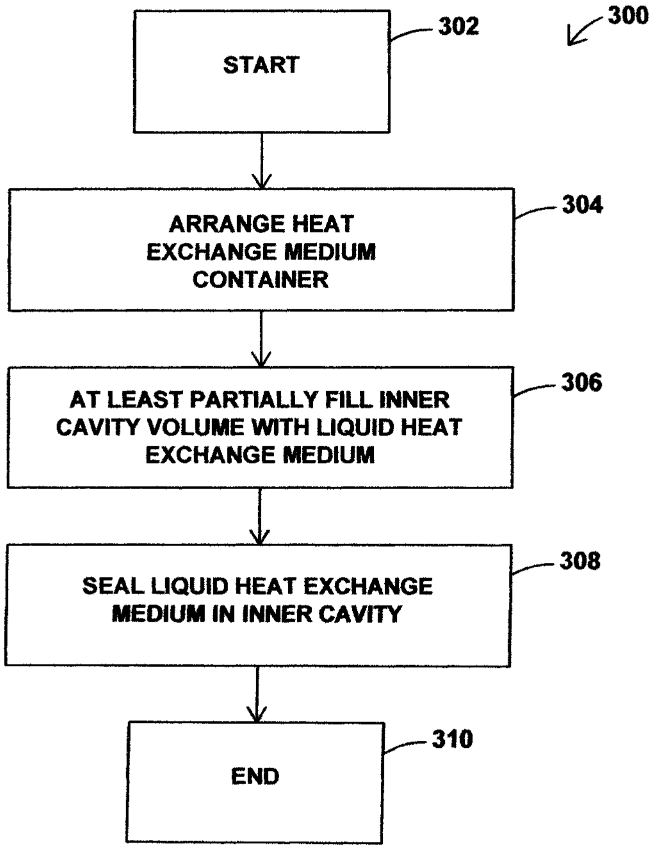
FIG. 10 is a flow diagram illustrating a method for cooling at least one LED.

A method 300 is shown in FIG. 10 for cooling at least one light emitting diode (LED) having an LED die that generates light and heat when electrical power is applied to the LED. Method 300 begins at a start 302 and then proceeds to a step 304 where a heat exchange medium container is arranged. The container is arranged to include a wall arrangement including at least one wall having a thickness that extends between an exterior surface configuration and an interior surface configuration such that the interior surface configuration defines an inner cavity volume. The container is also arranged to have an LED mounting area for mounting the LED to the exterior surface configuration of the container to transfer heat from the LED to a heat receiving portion of the interior surface configuration of the wall. Following step 304, method 300 proceeds to step 306 where the inner cavity volume is at least partially filled with a liquid heat exchange medium. The inner cavity volume is filled such that the medium contacts the heat receiving portion of the interior surface configuration of the wall in at least one physical orientation of the container to receive heat from the LED through the wall and to move at least a portion of the heat received away from the LED using convection. After step 306, the method proceeds to step 308 where the liquid heat exchange medium is sealed in the inner cavity. Method 300 then ends at step 310.

Figure 11:
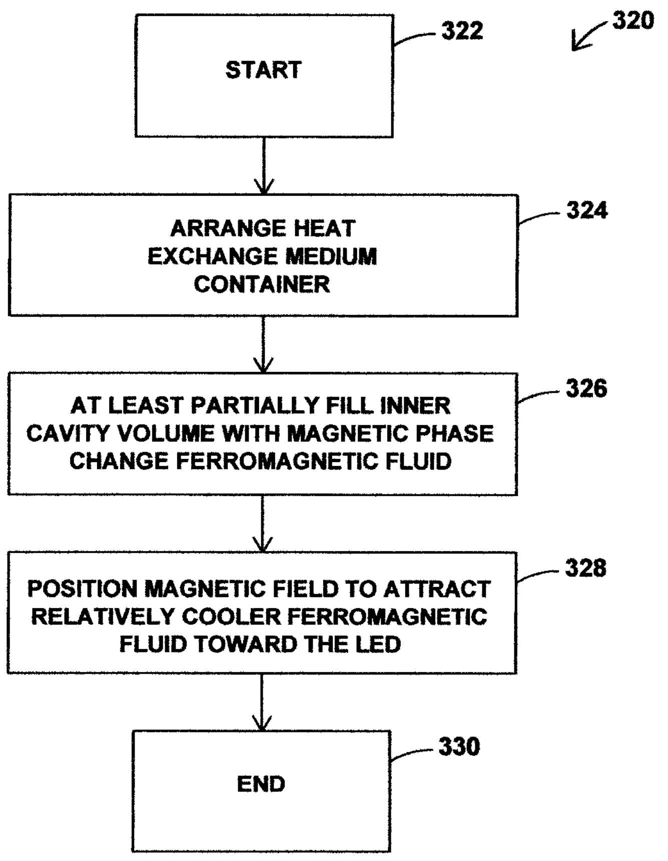
FIG. 11 is a flow diagram illustrating another method for cooling at least one LED.

A method 320 is shown in FIG. 11 for cooling at least one light emitting diode (LED) having an LED die that generates light and heat when electrical power is applied to the LED. Method 320 begins at start step 322 and then proceeds to a step 324 where a heat exchange medium container is arranged with a wall arrangement including at least one wall. The wall has a thickness that extends between an exterior surface configuration and an interior surface configuration such that the interior surface configuration defines an inner cavity volume. The container also has an LED mounting area for mounting the LED to the exterior surface configuration of the container to transfer heat from the LED to a heat receiving portion of the interior surface configuration of the wall. Following step 324, method 320 proceeds to step 326 where the inner cavity is at least partially filled with a magnetic fluid. The inner cavity is filled to at least cover the heat receiving portion of the interior surface of the wall with the magnetic fluid to receive heat from the LED. The magnetic fluid is selected to be relatively more magnetic when at a relatively cooler temperature and relatively less magnetic when at a relatively hotter temperature, such that operating the LED causes the magnetic fluid proximate to the LED to heat to a temperature sufficient to cause the fluid to become relatively less magnetic. After step 326, method 320 proceeds to step 328 where a magnetic field is positioned to circulate the magnetic fluid by magnetically attracting relatively cooler magnetic fluid toward the LED to push relatively hotter magnetic fluid heated by the LED away from the LED to remove heat from the LED during operation of the LED. After step 328, method 320 proceeds to step 330 where the method ends.

While a number of exemplary aspects and embodiments have been discussed above, those of skill in the art will recognize certain modifications, permutations, additions and sub-combinations thereof. It is therefore intended that the following appended claims and claims hereafter introduced are interpreted to include all such modifications, permutations, additions and sub-combinations as are within their true spirit and scope.

What is claimed is:

1. A method for cooling at least one light emitting diode (LED) having a LED die that generates light and heat when electrical power is applied to the LED, the method comprising:

arranging a heat exchange medium container with a wall arrangement including at least one wall having a thickness that extends between an exterior surface configuration and an interior surface configuration such that the interior surface configuration defines an inner cavity volume, the container also having an LED mounting area for mounting the LED to the exterior surface configuration of the container to transfer heat from the LED to a heat receiving portion of the interior surface configuration of the wall;

at least partially filling the inner cavity volume with a magnetic fluid to at least cover the heat receiving portion of the interior surface of the wall with the magnetic fluid to receive heat from the LED, and selecting the magnetic fluid to be relatively more magnetic when at a relatively cooler temperature and relatively less magnetic when at a relatively hotter temperature, such that operating the LED causes the magnetic fluid proximate to the LED to heat to a temperature sufficient to cause the fluid to become relatively less magnetic; and positioning a magnetic field to circulate the magnetic fluid by magnetically attracting relatively cooler magnetic fluid toward the LED to push relatively hotter magnetic fluid heated by the LED away from the LED to remove heat from the LED during operation of the LED.

2. A method as defined in claim 1, further comprising: configuring the container to have an upper portion of the inner cavity volume that is above the LED mounting area regardless of the physical orientation of the container.

3. A method as defined in claim 1 wherein selecting the magnetic fluid includes selecting a phase change ferromagnetic fluid.

4. A method as defined in claim 3 wherein selecting the ferromagnetic fluid includes selecting a Curie temperature of the fluid such that the relatively hotter temperature is above the Curie temperature and the relatively cooler temperature is below the Curie temperature.

5. A method as defined in claim 4 wherein the LED is operable at an LED temperature that is below an LED damaging temperature to substantially avoid heat damage to the LED, and wherein selecting the ferromagnetic fluid includes selecting the Curie temperature of the fluid such that circulating the ferromagnetic fluid maintains the LED temperature below the LED damaging temperature.

6. A method as defined in claim 3 wherein selecting the ferromagnetic fluid includes selecting the fluid as an alloy of $Fe_2P_{1-X}As_X$, wherein the phosphorus content is 1−X and is selected to be between 0 and 1.

7. A method as defined in claim 6 wherein the phosphorus content is selected to be approximately 0.9.

8. A method as defined in claim 1, wherein said magnetic fluid increases in volume responsive to an increase in temperature, the method further comprising:

sealing the magnetic fluid in the inner cavity; and positioning a compressible element in the inner cavity volume, such that the compressible element and the magnetic fluid substantially completely fill the inner cavity volume and the compressible element is at least partially surrounded by the magnetic fluid, the compressible element having a characteristic in which the compressible element decreases in volume to compensate for heat related increases in volume of the magnetic fluid.

9. A method as defined in claim 1 wherein arranging the medium container includes configuring at least a portion of the medium container to serve as a reflector for directing light from the LED.

10. A method as defined in claim 1 wherein arranging the medium container includes configuring at least a portion of the medium container to promote heat exchange between the container and air.

11. A cooling device for cooling at least one light emitting diode (LED) having an LED die that generates light and heat when electrical power is applied to the LED, the cooling device comprising:

a heat exchange medium container configured with a wall arrangement including at least one wall having a thickness that extends between an exterior surface configuration and an interior surface configuration of the container such that the interior surface configuration defines an inner cavity volume, the container also having an LED mounting area for mounting the LED to the exterior surface configuration of the container to transfer heat from the LED to a heat receiving portion of the interior surface configuration of the wall;

a magnetic fluid at least partially filling the inner cavity volume to at least cover the heat receiving portion of the interior surface of the wall with the magnetic fluid to receive heat from the LED, the magnetic fluid having a characteristic in which the fluid is relatively more magnetic when at a relatively cooler temperature and relatively less magnetic when at a relatively hotter temperature, such that operating the LED causes the magnetic fluid proximate to the LED to heat to a temperature sufficient to cause the fluid to become relatively less magnetic; and a magnet having a magnetic field that is positioned to circulate the magnetic fluid by magnetically attracting relatively cooler magnetic fluid toward the LED to push relatively hotter magnetic fluid heated by the LED away from the LED to remove heat from the LED during operation of the LED.

12. A cooling device as defined in claim 11, wherein the container is configured to have an upper portion of the inner cavity volume that is above the LED mounting area regardless of the physical orientation of the container.

13. A cooling device as defined in claim 11 wherein the magnetic fluid is a phase change ferromagnetic fluid.

14. A cooling device as defined in claim 13 wherein the ferromagnetic fluid includes a Curie temperature such that the relatively hotter temperature is above the Curie temperature and the relatively cooler temperature is below the Curie temperature.

15. A cooling device as defined in claim 14 wherein the LED is operable at an LED temperature that is below an LED damaging temperature to substantially avoid heat damage to the LED, and wherein the Curie temperature of the fluid is such that circulating the ferromagnetic fluid maintains the LED temperature below the LED damaging temperature.

16. A cooling device as defined in claim 13 wherein the ferromagnetic fluid is an alloy of $Fe_2P_{1-X}As_X$, wherein the phosphorus content is 1−X and is between 0 and 1.

17. A cooling device as defined in claim 16 wherein the phosphorus content is approximately 0.9.

18. A cooling device as defined in claim 11, wherein said magnetic fluid increases in volume responsive to an increase in temperature and the magnetic fluid is sealed in the inner cavity, the cooling device further comprising:

a compressible element positioned in the inner cavity volume, such that the compressible element and the magnetic fluid substantially completely fill the inner cavity volume and the compressible element is at least partially surrounded by the magnetic fluid, the compressible element having a characteristic in which the compressible element decreases in volume to compensate for heat related increases in volume of the magnetic fluid.

19. A cooling device as defined in claim 11, wherein at least a portion of the medium container is configured to serve as a reflector for directing light from the LED.

20. A cooling device as defined in claim 11 wherein at least a portion of the medium container is configured to promote heat exchange between the container and air.

21. A method for operating a light-emitting diode (LED) (i) having an LED die that generates light and heat when electrical power is applied to the LED and (ii) being mounted on an exterior surface of a heat exchange medium container having an interior cavity volume at least partially filled with a magnetic fluid that is relatively more magnetic when at a relatively cooler temperature and relatively less magnetic when at a relatively hotter temperature, the method comprising:

applying electrical power to the LED to operate the LED, whereby heat generated by the LED during operation is drawn away by the magnetic fluid circulating under the influence of a magnetic field.

22. The method of claim 21, wherein the heat exchange medium container is configured to have a portion of the interior cavity volume disposed above the LED regardless of the physical orientation of the heat exchange medium container.

23. The method of claim 21, wherein the magnetic fluid comprises a phase-change ferromagnetic fluid.

24. The method of claim 21, wherein the magnetic fluid has a Curie temperature below a maximum safe operating temperature of the LED.

25. The method of claim 21, wherein the magnetic fluid has a Curie temperature below approximately 80° C.

26. The method of claim 21, wherein the magnetic fluid comprises $Fe_2P_{1-X}As_X$, wherein $0 \leqq X \leqq 1$.

27. The method of claim 26, wherein X is approximately 0.1.

28. The method of claim 21, wherein, during operation of the LED, a volume of at least a portion of the magnetic fluid expands in response to increased temperature and compresses a compressible element disposed within the interior cavity volume.

29. The method of claim 21, wherein at least a portion of the heat exchange medium container reflects light emitted by the LED during operation.

30. The method of claim 21, wherein the magnetic field arises from a magnet disposed proximate the LED die.

31. The method of claim 30, wherein the magnet is disposed at least partially within the interior cavity volume.

32. An illumination device comprising:

a heat exchange medium container having an exterior surface and an interior cavity volume;

mounted on the exterior surface of a heat exchange medium container, a light emitting diode (LED) having an LED die that generates light and heat when electrical power is applied to the LED;

at least partially filling the interior cavity volume, a magnetic fluid that is relatively more magnetic when at a relatively cooler temperature and relatively less magnetic when at a relatively hotter temperature; and a magnet for generating a magnetic field that circulates the magnetic fluid during operation of the LED to draw away heat generated by the LED die.

33. The illumination device of claim 32, wherein the heat exchange medium container is configured to have a portion of the interior cavity volume disposed above the LED regardless of the physical orientation of the heat exchange medium container.

34. The illumination device of claim 32, wherein the magnetic fluid comprises a phase-change ferromagnetic fluid.

35. The illumination device of claim 32, wherein the magnetic fluid has a Curie temperature below a maximum safe operating temperature of the LED.

36. The illumination device of claim 32, wherein the magnetic fluid has a Curie temperature below approximately 80° C.

37. The illumination device of claim 32, wherein the magnetic fluid comprises $Fe_2P_{1-X}As_X$, wherein $0 \leqq X \leqq 1$.

38. The illumination device of claim 37, wherein X is approximately 0.1.

39. The illumination device of claim 32, further comprising, disposed within the interior cavity volume, an element compressible to accommodate volumetric expansion of the magnetic fluid.

40. The illumination device of claim 32, wherein at least a portion of the heat exchange medium container is reflective to light emitted by the LED.

41. The illumination device of claim 32, wherein the magnet is disposed at least partially within the interior cavity volume.

* * * * *